US010727290B2

(12) United States Patent
Yamamoto

(10) Patent No.: US 10,727,290 B2
(45) Date of Patent: Jul. 28, 2020

(54) ACTIVE-MATRIX DISPLAY DEVICE INCLUDING TFT SUBSTRATE WITH TWO LAYERS ARRANGED IN SYMMETRY WITH SAME-COLORED SUBPIXELS

(71) Applicant: JOLED INC., Tokyo (JP)

(72) Inventor: Tetsuro Yamamoto, Tokyo (JP)

(73) Assignee: JOLED INC., Tokyo (JP)

( * ) Notice: Subject to any disclaimer, the term of this patent is extended or adjusted under 35 U.S.C. 154(b) by 199 days.

(21) Appl. No.: 15/888,398

(22) Filed: Feb. 5, 2018

(65) Prior Publication Data

US 2018/0226466 A1 Aug. 9, 2018

(30) Foreign Application Priority Data

Feb. 9, 2017 (JP) ................. 2017-022561

(51) Int. Cl.
  *H01L 27/32* (2006.01)
  *G09G 3/3233* (2016.01)
  *G09G 3/3241* (2016.01)
  *G09G 3/20* (2006.01)

(52) U.S. Cl.
  CPC ....... *H01L 27/3276* (2013.01); *G09G 3/3233* (2013.01); *G09G 3/3241* (2013.01); *H01L 27/3211* (2013.01); *H01L 27/3262* (2013.01); *H01L 27/3265* (2013.01); *G09G 3/2003* (2013.01); *G09G 2300/0413* (2013.01); *G09G 2300/0426* (2013.01);
(Continued)

(58) Field of Classification Search
  CPC ............ H01L 27/3276; H01L 27/3211; H01L 27/3262; H01L 27/3265; H01L 27/3206; H01L 27/326; H01L 27/3218; H01L 27/3216; H01L 27/3233; H01L 27/32; H01L 27/3248; H01L 27/3258; H01L 27/3246; G09G 2300/0443; G09G 2300/0426
  See application file for complete search history.

(56) References Cited

U.S. PATENT DOCUMENTS 6,512,504 B1   1/2003 Yamauchi et al.
6,771,028 B1 *  8/2004 Winters ............... G09G 3/3233
                                                 315/169.1
(Continued)

FOREIGN PATENT DOCUMENTS

JP       2009-080491       4/2009

*Primary Examiner* — Thanhha S Pham
(74) *Attorney, Agent, or Firm* — Greenblum & Bernstein, P.L.C.

(57) ABSTRACT

An active-matrix display device includes pixels arranged in a matrix, and each of the pixels includes subpixels that are arranged along an X direction and emit light of mutually different colors. Each of the subpixels includes a TFT element provided on a TFT substrate and an organic EL element provided on the TFT substrate. The organic EL element has an opening which is a region from which emitted light exits, and the TFT substrate includes a first layer and a second layer. When same-colored subpixels of two of the pixels adjacent in the X direction are seen in a plan view, the first layer has a portion arranged in line symmetry between the same-colored subpixels and the second layer is disposed at an identical position in the openings of the same-colored subpixels.

8 Claims, 15 Drawing Sheets

(52) U.S. Cl.
CPC ............... *G09G 2300/0443* (2013.01); *G09G 2300/0819* (2013.01); *G09G 2320/028* (2013.01)

(56) References Cited

U.S. PATENT DOCUMENTS

| | | | |
|---|---|---|---|
| 6,919,681 B2* | 7/2005 | Cok | G09G 3/3216 313/500 |
| 2002/0125832 A1* | 9/2002 | Yokoyama | G09G 3/3225 315/169.3 |
| 2004/0108978 A1* | 6/2004 | Matsueda | G09G 3/3233 345/76 |
| 2006/0097628 A1* | 5/2006 | Suh | H01L 27/3211 313/504 |
| 2006/0170712 A1* | 8/2006 | Miller | H01L 27/3211 345/695 |
| 2009/0009673 A1* | 1/2009 | Hisada | G02F 1/1362 349/39 |
| 2009/0289963 A1* | 11/2009 | Minami | G09G 3/3233 345/690 |
| 2010/0156860 A1* | 6/2010 | Yamamoto | H01L 27/1255 345/205 |
| 2015/0356920 A1* | 12/2015 | Na | G09G 3/3233 345/205 |
| 2016/0104413 A1* | 4/2016 | Matsueda | H01L 27/3218 345/694 |
| 2016/0148981 A1* | 5/2016 | Matsueda | H01L 27/3218 257/40 |
| 2017/0194402 A1* | 7/2017 | Choi | H01L 27/3211 |

* cited by examiner

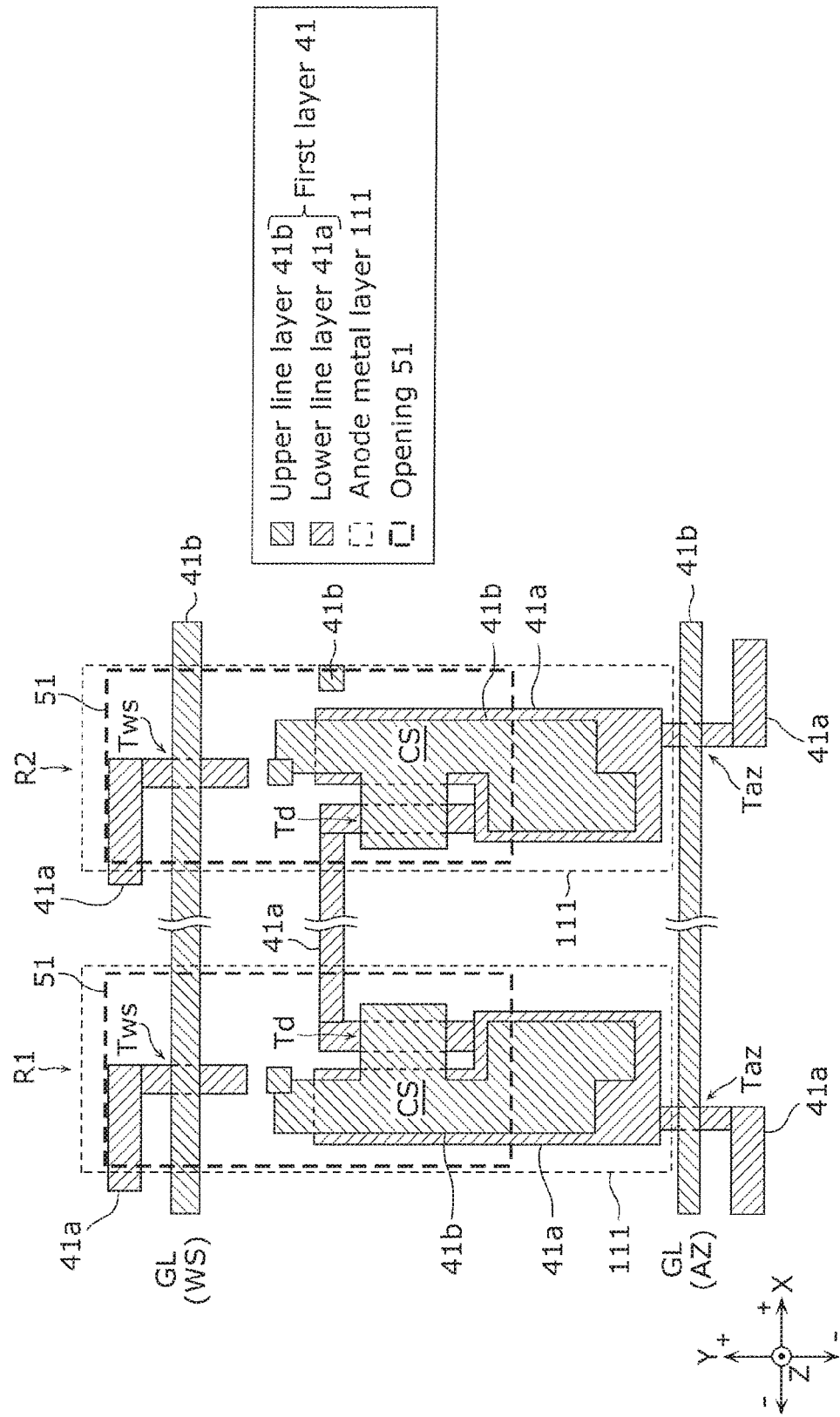

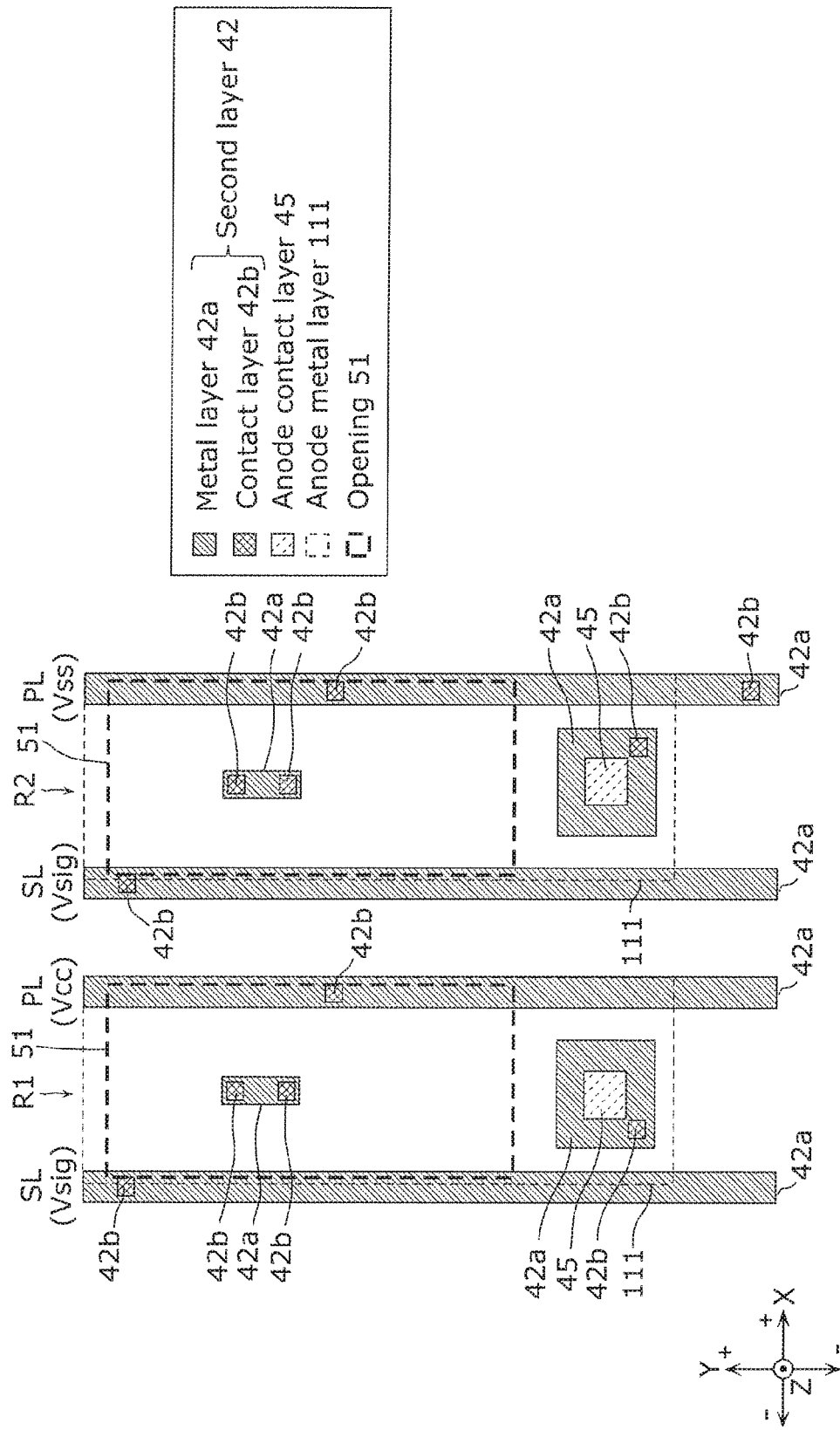

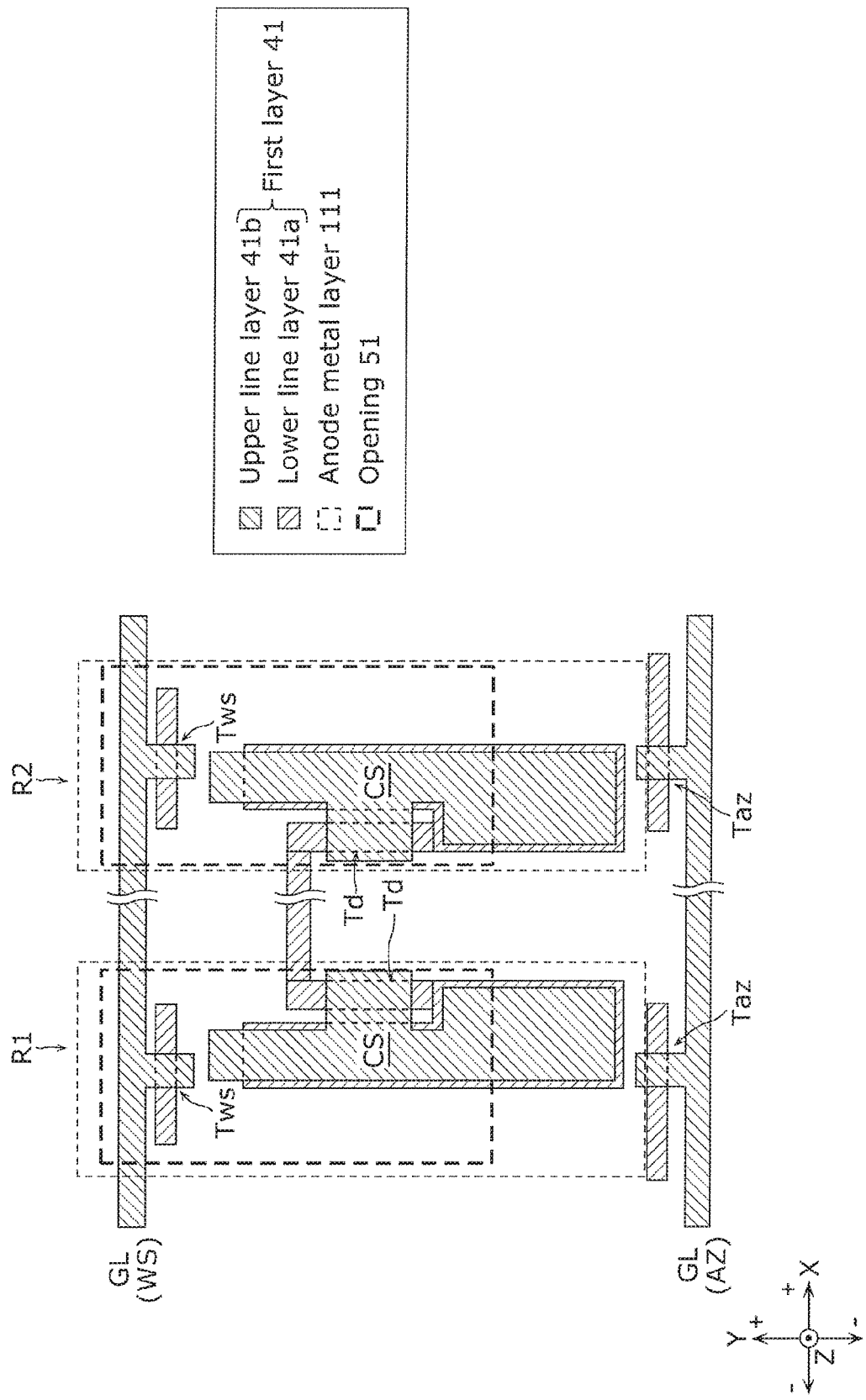

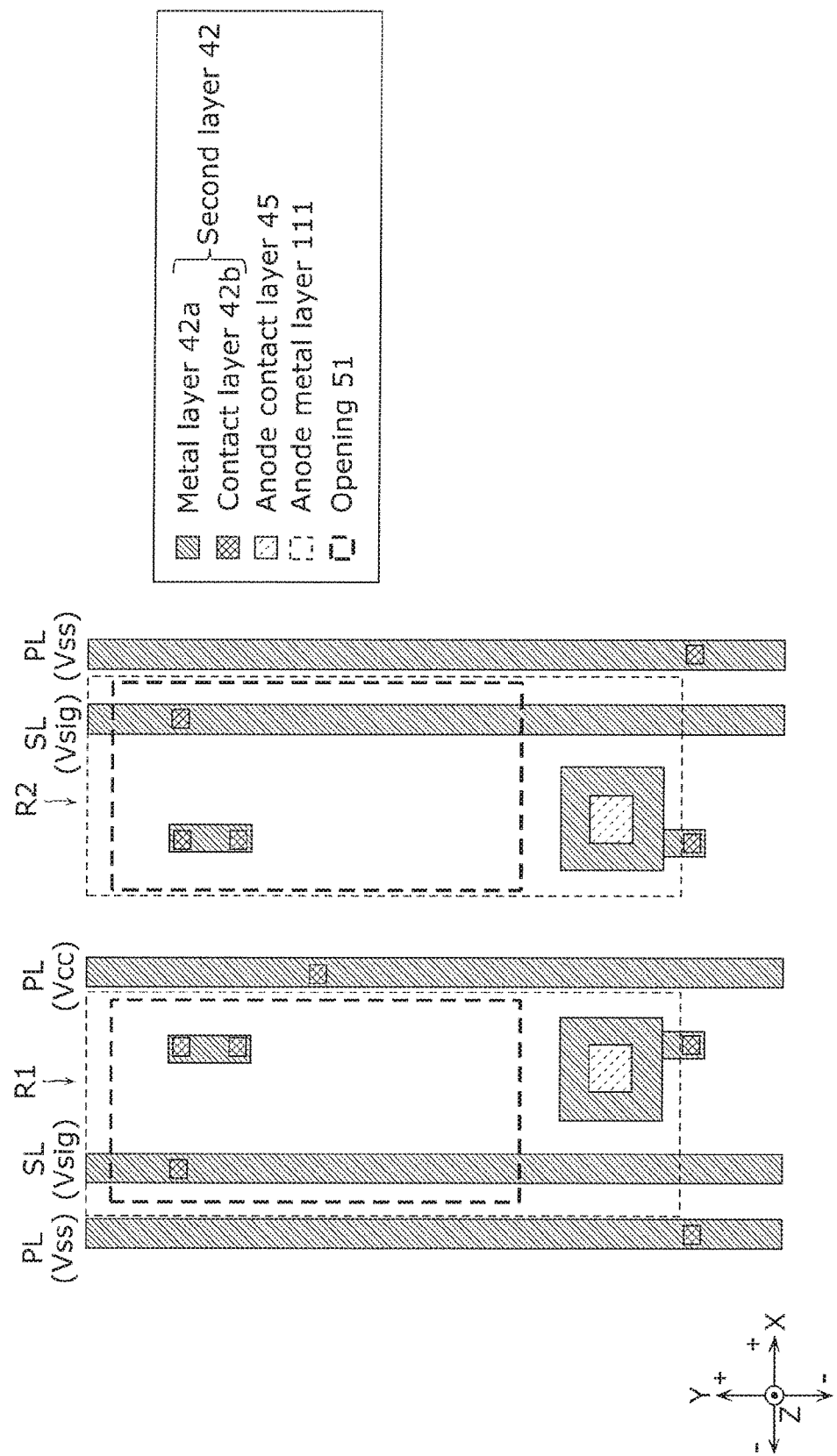

ACTIVE-MATRIX DISPLAY DEVICE INCLUDING TFT SUBSTRATE WITH TWO LAYERS ARRANGED IN SYMMETRY WITH SAME-COLORED SUBPIXELS

CROSS REFERENCE TO RELATED APPLICATION

The present application is based on and claims priority of Japanese Patent Application No. 2017-022561 filed on Feb. 9, 2017. The entire disclosure of the above-identified application, including the specification, drawings and claims is incorporated herein by reference in its entirety.

FIELD

The present disclosure relates to an active-matrix display device including a plurality of pixels arranged in a matrix.

BACKGROUND

Active-matrix display devices (display panels) such as organic electroluminescent (EL) display devices (using, for example, organic light-emitting diodes: OLEDs) include a display region in which a plurality of pixels are arranged along row and column directions in a matrix. Each of the plurality of pixels includes a plurality of subpixels which make up one set and emit mutually different colors of light. Each subpixel includes a thin film transistor (TFT) element and a capacitor provided on a TFT substrate, and a light-emitting element such as an organic EL element. Power supply lines which supply power to the respective subpixels are provided on the TFT substrate.

A configuration is known where, in such an active-matrix display device, two subpixels are disposed in bilateral symmetry with respect to a power supply line, and the single power supply line is shared by the two subpixels (see, for example, Patent Literature (PTL) 1). With this configuration, the number of power supply lines with respect to the number of subpixels can be reduced.

CITATION LIST

Patent Literature

[PTL 1] Japanese Unexamined Patent Application Publication No. 2009-80491

SUMMARY

Technical Problem

For example, an organic EL element is formed by applying a liquid resin material on the TFT substrate and drying the resin material. However, in this case, a step (or unevenness) attributable to the thickness of the power supply line is formed on the surface of the organic EL element. As such, in the configuration in which two subpixels are disposed in bilateral symmetry as described in Patent Literature 1, steps are formed in bilateral symmetry. Accordingly, there is the problem that there are cases where two same-colored subpixels have different thickness distributions, and thus viewing angle characteristics deteriorate.

The present disclosure is conceived in order to solve the aforementioned problem and has as an object to provide an active-matrix display device capable of improving viewing angle characteristics.

Solution to Problem

In order to achieve the aforementioned object, an active-matrix display device according to an aspect of the present disclosure includes a plurality of pixels arranged in a matrix, wherein each of the plurality of pixels includes a plurality of subpixels that are arranged along a predetermined direction and emit light of mutually different colors, each of the plurality of subpixels includes: a TFT element provided on a TFT substrate; and a light-emitting element that is provided on the TFT substrate and emits light according to driving by the TFT element, the light-emitting element has an opening which is a region from which emitted light exits, the TFT substrate includes a first layer and a second layer, and when same-colored subpixels that emit light of a same color out of the plurality of subpixels included in two of the plurality of pixels that are adjacent in the predetermined direction are seen from a thickness direction of the TFT substrate: the first layer has a portion arranged in line symmetry between the same-colored subpixels; and the second layer is disposed at an identical position in the openings of the same-colored subpixels.

Advantageous Effects

With the active-matrix display device according to the present disclosure, it is possible to improve viewing angle characteristics.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3B is a plan view of an arrangement of a first layer in the same-colored subpixels according to the embodiment.

FIG. 3C is a plan view of an arrangement of a second layer in the same-colored subpixels according to the embodiment.

FIG. 58B is a plan view of an arrangement of a first layer in the same-colored subpixels in the comparative example.

FIG. 5C is a plan view of an arrangement of a second layer in the same-colored subpixels in the comparative example.

DESCRIPTION OF EMBODIMENT

Hereinafter, an exemplary embodiment of an active-matrix display device according to the present disclosure will be described with reference to the drawings. It should be noted that the exemplary embodiment described below shows a specific example of the present disclosure. Therefore, the numerical values, structural components, the arrangement and connection of the structural components, etc., shown in the following embodiment are mere examples, and therefore do not limit the scope of the present disclosure. Furthermore, among the structural components in the following exemplary embodiment, components not recited in any one of the independent claims which indicate the broadest concepts of the present disclosure are described as arbitrary structural components.

In the respective figures, the same reference sign is given to substantially identical structural components. Furthermore, the respective figures are schematic diagrams, and therefore the ratio of film thicknesses, sizes of respective components, etc., are not necessarily precisely illustrated.

Embodiment 1-1. Overall Configuration

Figure 1:
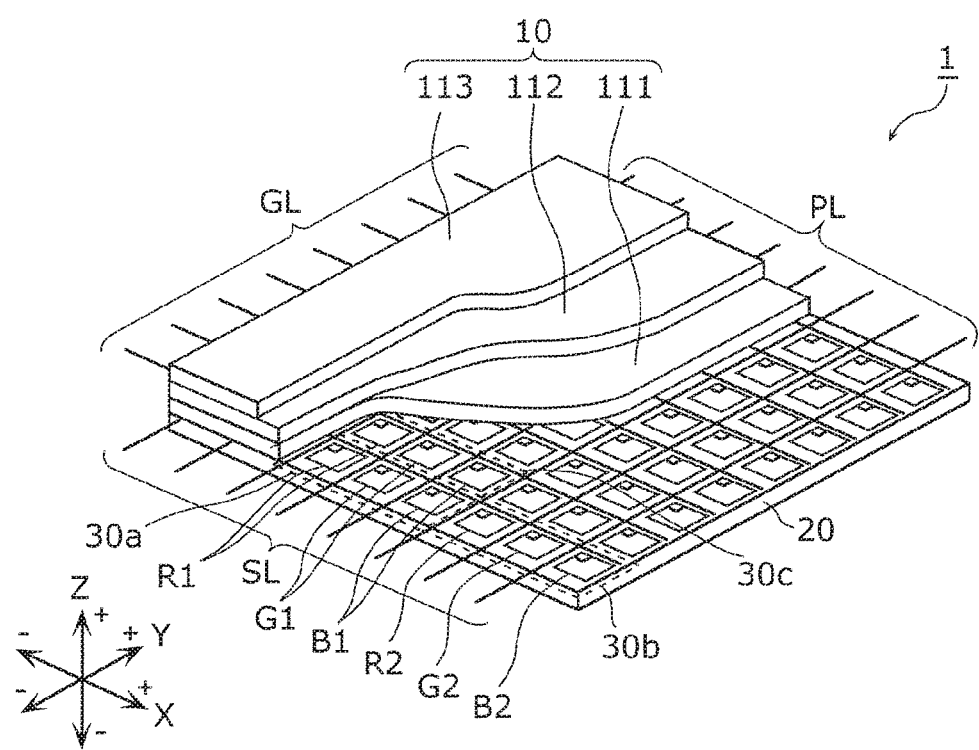
FIG. 1 is a partial cut-out perspective view of an active-matrix display device according to an embodiment.

The overall configuration of an active-matrix display device 1 (hereafter referred to as display device 1) according to this embodiment will be described based on FIG. 1. FIG. 1 is a partial cut-out perspective view of the display device 1.

The display device 1 is an active-matrix organic EL display device (organic EL display panel). The display device 1 includes a plurality of pixels 30a, 30b, 30c, . . . which are arranged along row and column directions in a matrix.

Hereinafter, in this embodiment, the direction in which pixels 30a, 30b, etc. are aligned is referred to as the X direction (column direction), a direction orthogonal to the X direction and in which pixels 30a, 30c, etc. are aligned is referred to as the Y direction (row direction), and the direction in which light is emitted from the display device 1, which is a direction orthogonal to both the X direction and the Y direction, is referred to as the Z direction. Furthermore, there are instances where the plurality of pixels 30a, 30b, 30c, . . . included in the display device 1 are collectively referred to as pixels 30.

As illustrated in FIG. 1, the display device 1 includes an organic EL element (light-emitting element) 10, and a TFT substrate 20 which includes a TFT element.

The organic EL element 10 includes an anode metal (AM) layer 111 having an anode, an organic EL layer 112 having a light-emitting layer, and a transparent electrode layer 113 having a cathode. The AM layer 111, the organic EL layer 112, and the transparent electrode layer 113 are stacked in this order on the TFT substrate 20.

The TFT substrate 20 includes a plurality of gate lines GL provided extending along the X direction, a plurality of signal lines SL provided extending along the Y direction, and a plurality of power supply lines PL provided extending along the Y direction. The signal lines SL and the gate lines GL are arranged to be orthogonal to each other.

Each of the pixels 30 includes a plurality of subpixels which make up one set and emit mutually different colors of light.

For example, the pixel 30a includes a subpixel R1 corresponding to red of the RGB primary colors, a subpixel G1 corresponding to green, and a subpixel B1 corresponding to blue. For example, the pixel 30b located beside the pixel 30a in the X direction includes a subpixel R2 corresponding to red, a subpixel G2 corresponding to green, and a subpixel B2 corresponding to blue. The subpixels R1, G1, B1, R2, G2, and B2 are arranged in this order along the X direction. Furthermore, the pixel 30c located beside the pixel 30a in the Y direction includes subpixels R1, G1, and B1 arranged in this order along the X direction, in the same manner as the pixel 30a.

In the display device 1, TFT elements and organic EL elements 10 are provided corresponding to each of the subpixels R1, G1, B1, R2, G2, and B2 (hereinafter also referred to as subpixels R, G, B), and an active-matrix system which performs display control on each of the subpixels R, G, B is employed.

In other words, the display device 1 according to this embodiment includes the pixels 30 arranged in a matrix, and each of the pixels 30 includes the plurality of subpixels R, G, B arranged along the X direction and emitting mutually different colors of light. Each of the plurality of subpixels R, G, B has a TFT element provided in the TFT substrate 20, and an organic EL element 10 which is provided on the TFT substrate 20 and emits light according to the driving by the TFT element.

In addition, when same-colored subpixels (for example, R1 and R2) of the two pixels 30a and 30b adjacent in the X direction are seen from a thickness direction of the TFT substrate 20, a first layer inside the TFT substrate 20 is arranged in line symmetry between the same-colored subpixels R1 and R2. By arranging the first layer in line symmetry, the shape and the peripheral potential of the electrical elements such as the TFT elements making up the subpixels R1 and R2 can be made the same, and the electrical properties such as the parasitic capacitance and the parasitic resistance occurring in the TFT substrate 20 can be made uniform.

Furthermore, in this embodiment, a second layer, which has a greater impact in the step-forming on the surface of the organic EL element 10 than the first layer, is disposed at an identical position inside the respective openings (light emission regions) of the same-colored subpixels R1 and R2. By placing the second layer at an identical position in the aforementioned openings in the same-colored subpixels R1 and R2 in the manner described above, the steps that are formed on the surface of the organic EL elements 10 can be formed at an identical position in the openings. When the same-colored subpixels R1 and R2 have different thickness distributions, the viewing angle characteristics of the display device deteriorate. However, in this embodiment, the above-described configuration enables the openings of the same-colored pixels R1 and R2 to have the same film thickness distribution and thus the viewing angle characteristics of the display device 1 can be improved. Next, details of the display device 1 will be described.

1-2. Circuit Configuration of Pixel

Figure 2A:
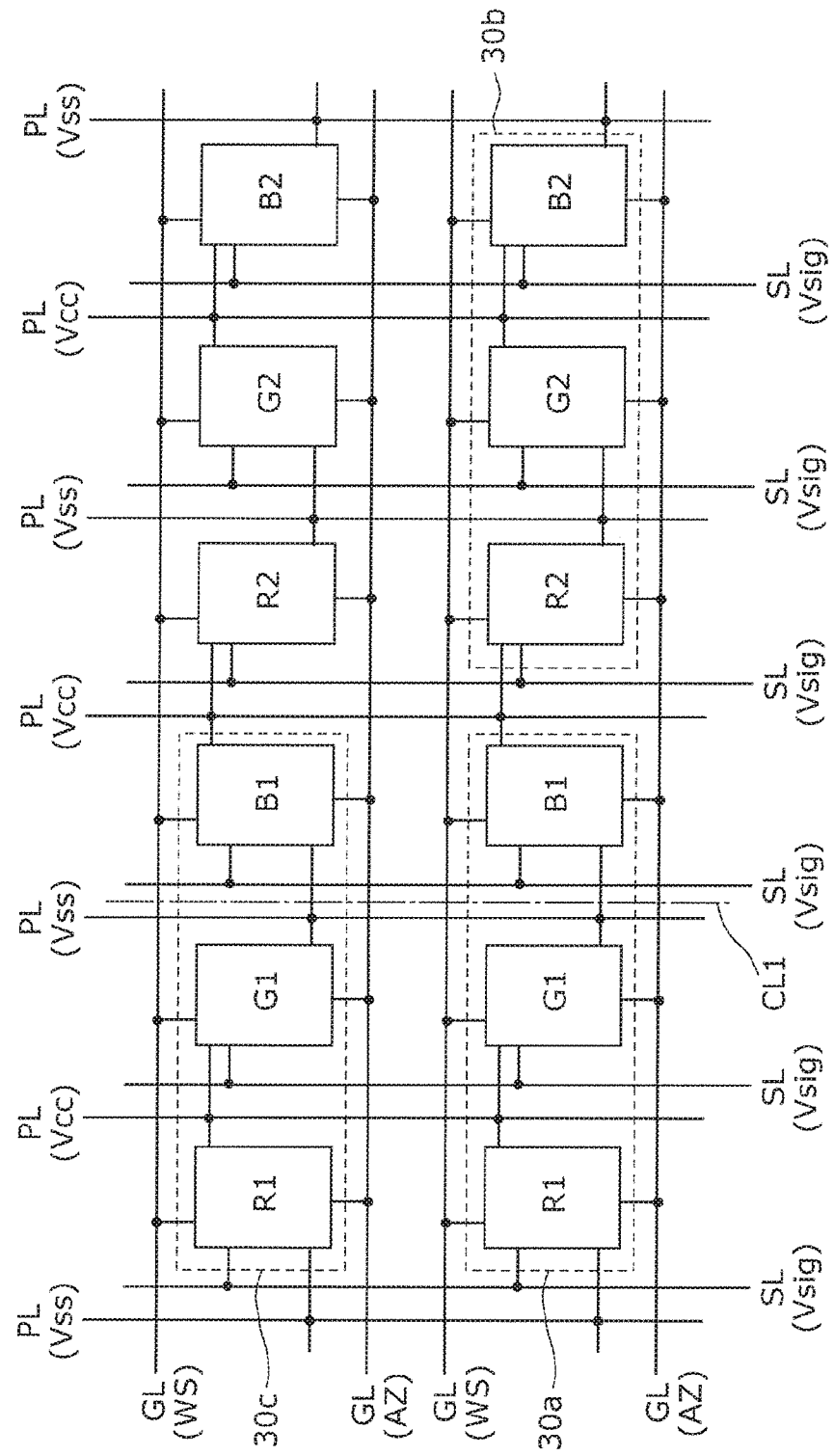
FIG. 2A is a diagram illustrating an outline configuration of pixels of the display device according to the embodiment.

First, the circuit configuration of the pixel 30 of display device 1 will be described. FIG. 2A is a diagram illustrating an outline configuration of pixels 30 of display device 1.

The display device 1 includes a plurality of power supply lines PL which supply a power supply voltage Vcc to the subpixels R, G, B, and a plurality of power supply lines PL which supply an initialization voltage Vss for initializing the voltage of the capacitor provided inside the subpixels R, G, B. Furthermore, the display device 1 has a plurality of signal lines SL which supply a signal voltage Vsig to the subpixels R, G, B. Furthermore, the display device 1 has a plurality of gate lines GL which supply timing signals (gate voltages) such as a WS signal and an AZ signal to the subpixels R, G, B.

Each of the two types of power supply lines PL are provided extending along a direction (Y direction) orthogonal to the direction in which the subpixels R1, G1, and B1 are arranged. Furthermore, the power supply line PL (Vcc) which supplies the power supply voltage Vcc and the power supply line PL (Vss) which supplies the initialization voltage Vss are disposed alternately at equal pitches, so that one of the power supply lines PL (one of Vcc and Vss) corresponds to one of the subpixels among the subpixels R1, G1, and B1 arranged in the X direction.

Each of the two types of power supply lines PL is shared between two adjacent different-colored subpixels. For example, the power supply line PL (Vcc) is shared by the subpixels R1 and G1, then the next adjacent power supply line PL (Vss) is shared by the subpixels G1 and B1, then the next adjacent power supply line PL (Vcc) is shared by the subpixels B1 and R2, then the next adjacent power supply line PL (Vss) is shared by the subpixels R2 and G2, then the next adjacent power supply line PL (Vcc) is shared by the subpixels G2 and B2.

Each of the signal lines SL are provided extending along a direction (Y direction) orthogonal to the direction in which the subpixels R1, G1, and B1 are arranged. Furthermore, the signal lines SL are disposed at equal pitches so that one signal line SL corresponds to one subpixel.

Each of the gate lines GL is provided extending along the direction (X direction) in which the subpixels R1, G1, and B1 are arranged. Furthermore, the gate lines GL are disposed so that two gate lines GL (WS) and GL (AZ) correspond to one subpixel.

It should be noted that the wiring layout of the pixels 30 in the display device 1 is repeated on a 2-pixel basis along the X direction and repeated on a 1-pixel basis along the Y direction. For example, for the pixels 30 in the X direction, the wiring layout for subpixels R1, G1, B1, R2, G2, B2 of the set composed of the pixels 30a and 30b is repeated. Furthermore, for the pixels 30 in the Y direction, wiring layouts of subpixels R1, G1, B1, R2, G2, B2 are arranged side-by-side on a same-color basis.

Figure 2B:
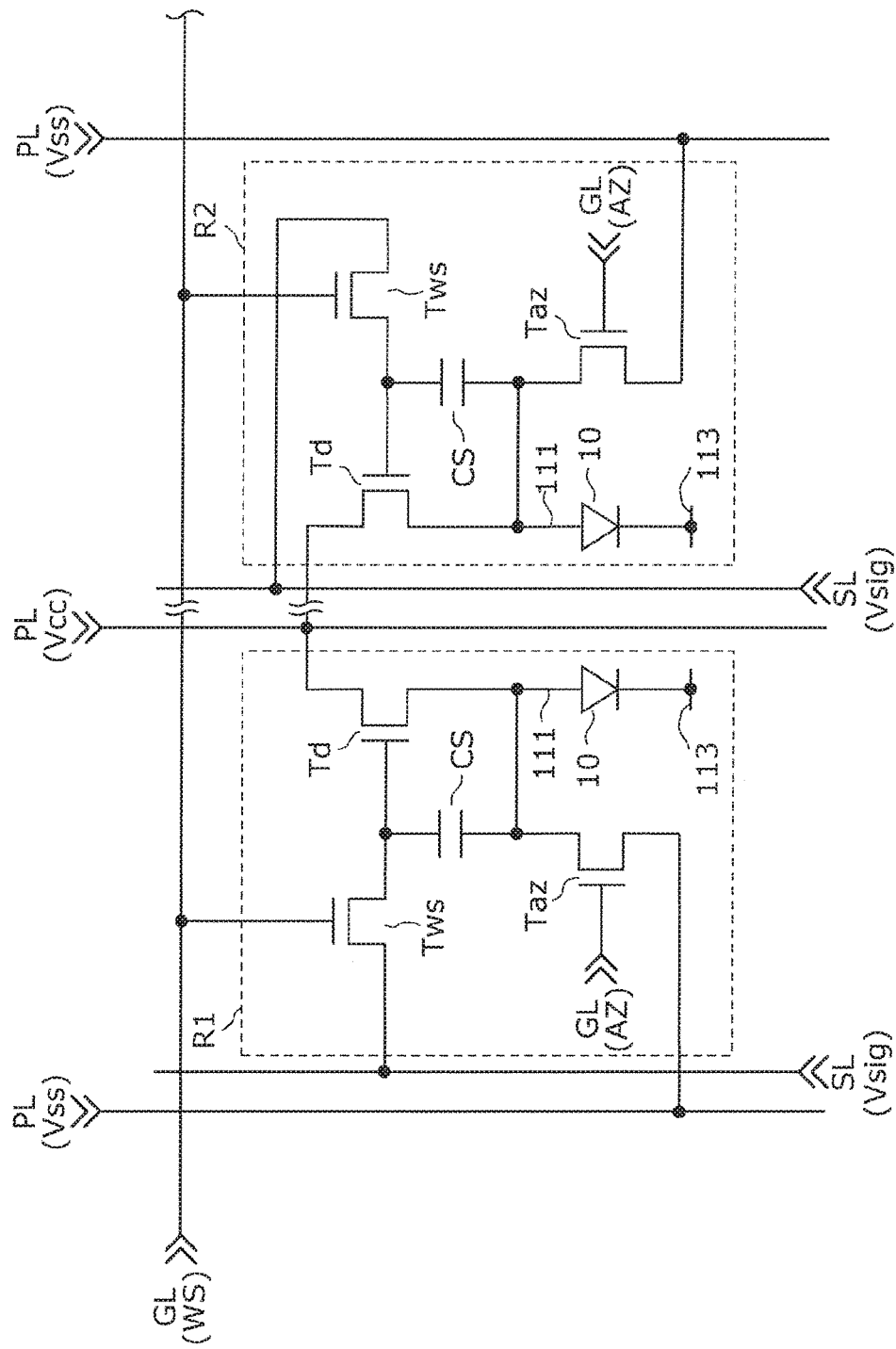
FIG. 2B is a circuit diagram illustrating same-colored subpixels of pixels according to the embodiment.

FIG. 2B is a circuit diagram illustrating subpixels R1 and R2 of the pixels 30. In FIG. 2B, the same-colored subpixels R1 and R2 of the two pixels 30a and 30b adjacent in the X direction are illustrated in an extracted state.

Hereinafter, description will be carried out using the same-colored subpixels R1 and R2 of the two pixels 30a and 30b as examples. It should be noted that the subpixels G1 and G2 of the pixels 30a and 30b have the same relationship as the subpixels R1 and R2, and the subpixels B1 and B2 of the pixels 30a and 30b have the same relationship as the subpixels R1 and R2.

As illustrated in FIG. 2B, each of the same-colored subpixels R1 and R2 includes transistors Td, Tws, and Taz, a capacitor CS, and an organic EL element 10.

The organic EL element 10 is a light-emitting element that emits light according to the pixel current supplied by the transistor Td.

The transistor Td is a drive transistor that causes the organic EL element 10 to emit light, by supplying the organic EL element 10 with a pixel current corresponding to the voltage held by the capacitor CS. The transistor Tws is a switching transistor for writing, into the capacitor CS, a signal voltage Vsig supplied by the signal line SL. The transistor Taz is a switching transistor for initializing (auto-zeroing) the voltage of the capacitor CS. Each of the transistors Td, Tws, and Taz is formed from an n-channel TFT element.

The capacitor CS is a capacitor that holds a voltage corresponding to data (here, the signal voltage Vsig) supplied from the signal line SL, and has a first electrode and a second electrode disposed at opposing positions. The first electrode of the capacitor CS is connected to the gate of the transistor Td, and the second electrode is connected to the source of the transistor Taz. For example, the capacitor CS holds a threshold voltage Vth of the transistor Td, and in addition holds a voltage (Vsig+Vth) obtained by compensating the threshold voltage Vth of the drive transistor Td with the signal voltage Vsig supplied from the source line SL.

In the subpixels R1 and R2 configured in this way, when the AZ signal supplied by the gate line GL causes the transistor Taz to switch from an On state to an Off state, the capacitor CS detects and holds the threshold voltage Vth of the transistor Td. Subsequently, when the WS signal supplied by the gate line GL brings the transistor Tws into the On state and thereby the signal voltage Vsig is supplied, the capacitor CS holds the voltage (Vsig+Vth). With this, the transistor Td supplies the organic EL element 10 with the pixel current corresponding to the signal voltage Vsig which does not depend on the threshold voltage Vth of the transistor Td.

1-3. Wiring Configuration of Pixel

Next, the wiring configuration of the pixels 30 in the display device 1 will be described with reference to FIG. 3A to FIG. 3E. It should be noted that, here, description is carried out focusing on the same-colored subpixels R1 and R2 of the two pixels 30a and 30b adjacent in the X direction.

Figure 3A:
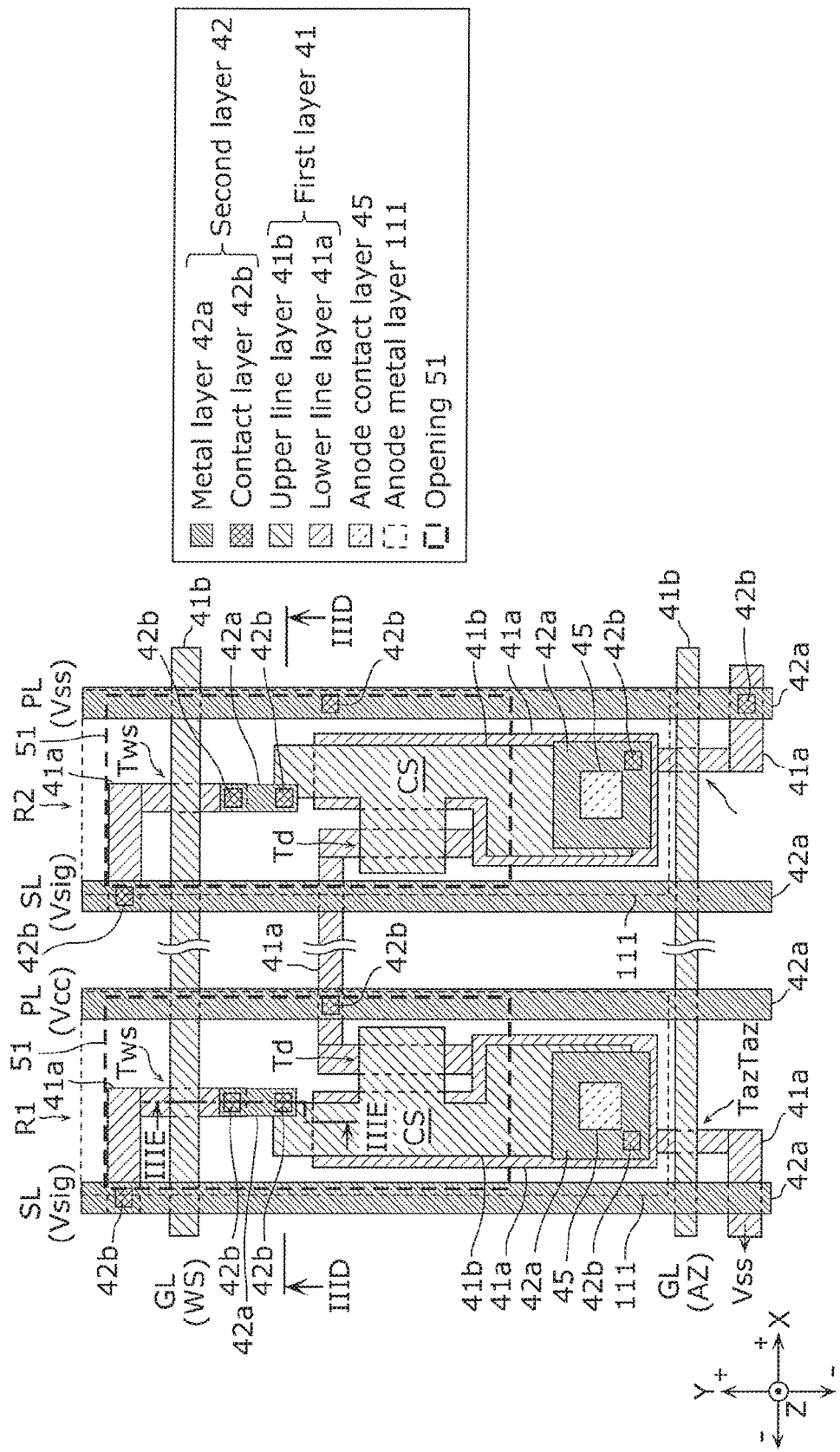
FIG. 3A is a plan view of a wiring layout of the same-colored pixels according to the embodiment.

FIG. 3A is a plan view of the wiring layout of the same-colored subpixels R1 and R2 of the pixels 30. FIG. 3B is a plan view of the arrangement of a first layer 41 in the same-colored subpixels R1 and R2. FIG. 3C is a plan view of the arrangement of a second layer 42 in the same-colored subpixels R1 and R2.

As illustrated in FIG. 3A to FIG. 3C, each of the subpixels R1 and R2 includes the transistors Td, Tws, and Taz, and the capacitor CS. The power supply line PL (Vcc), the signal line SL, and the gate lines GL (WS) and GL (AZ) are disposed in the periphery of the subpixel R1. The power supply line PL (Vss), the signal line SL, and the gate lines GL (WS) and GL (AZ) are disposed in the periphery of the subpixel R2.

The power supply lines PL (Vcc) and PL (Vss) and the signal line SL are formed by portions of the second layer 42 to be described later, and the gate lines GL (WS) and GL (AZ), the transistors Td, Tws, and Taz, and the capacitor CS are formed by portions of the first layer 41 to be described later. It should be noted that the AM layer 111 of the organic EL element 10 is connected to the first layer 41 via an anode contact layer 45, a metal layer 42a, and contact layers 42b.

Here, the relationship between the respective components and the respective layers will be described with reference to cross-sectional views of the subpixels R1 and R2.

Figure 3D:
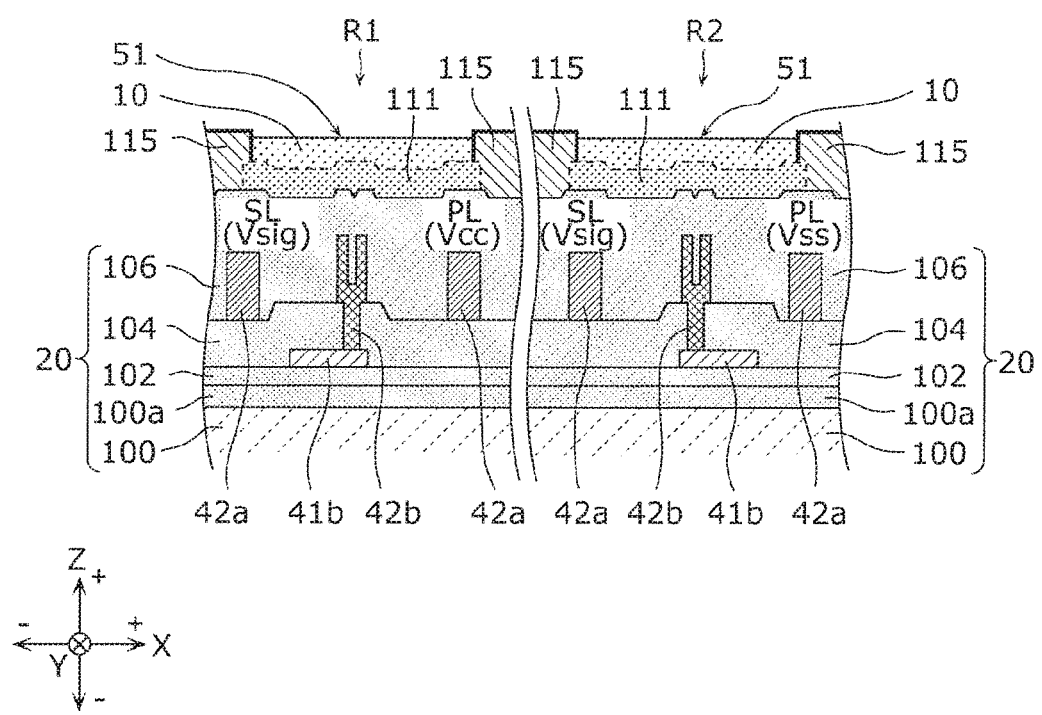
FIG. 3D is a cross-sectional view (cross-sectional view taken along line IIID-IIID in FIG. 3A) of wiring in the same-colored subpixels according to the embodiment.
Figure 3E:
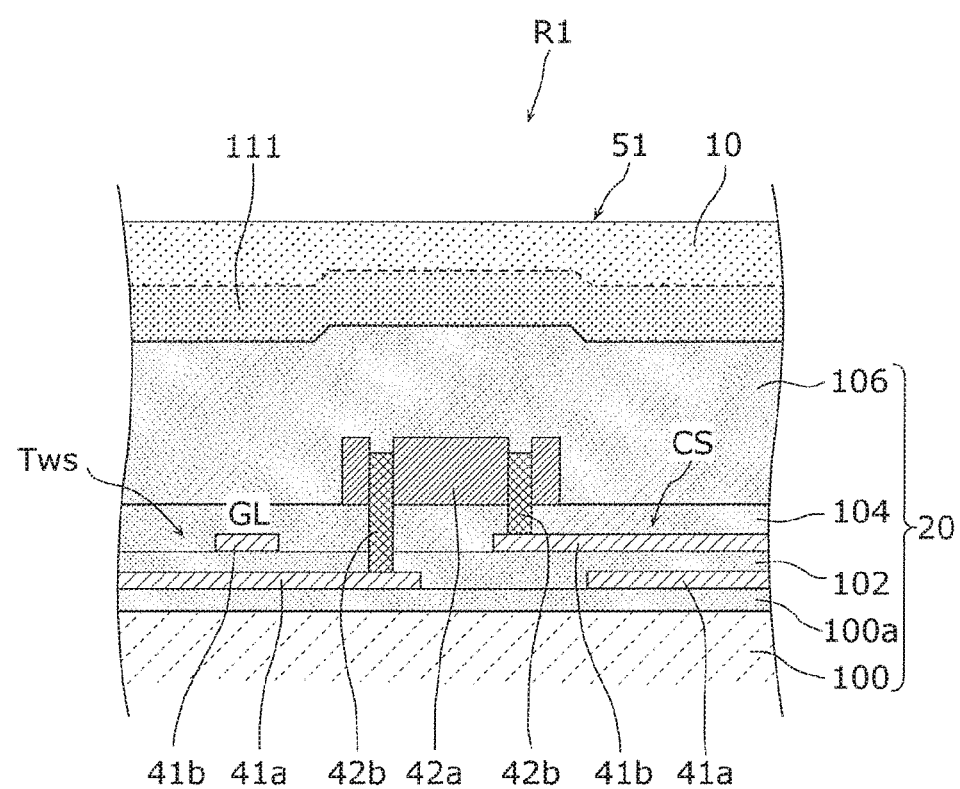
FIG. 3E is a cross-sectional view (cross-sectional view taken along line IIIE-IIIE in FIG. 3A) of wiring in a subpixel according to the embodiment.
Figure 3E:
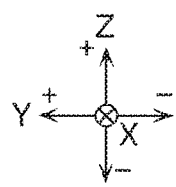

FIG. 3D and FIG. 3E are cross-sectional views illustrating the wiring of the subpixels R1 and R2; FIG. 3D is a cross-sectional view taken along line IIID-IIID in FIG. 3A, and FIG. 3E is a cross-sectional view taken along line IIIE-IIIE in FIG. 3A.

As illustrated in FIG. 3D and FIG. 3E, the TFT substrate 20 includes a substrate 100, a first insulating layer 102, a second insulating layer 104, and a third insulating layer 106. The TFT substrate 20 includes the first layer 41 having a lower line layer 41a and an upper line layer 41b, and the second layer 42 having a metal layer 42a and contact layers 42b. The second layer 42 is disposed closer to the organic EL element 10 than the first layer 41 is.

The substrate 100 is, for example, a glass substrate or a flexible resin substrate. It should be noted that the substrate 100 includes a protective layer 100a formed on the substrate 100.

The lower line layer 41a of the first layer 41 is formed on substrate 100. As illustrated in FIG. 3E, the lower line layer 41a is a layer that includes the channel of the transistor Tws, and is also a layer that includes the first electrode of the capacitor CS. It should be noted that the lower line layer 41a also includes the channels of the transistors Td and Taz (see FIG. 3B).

The first insulating layer 102 is provided on the substrate 100 to cover the lower line layer 41a.

The upper line layer 41b of the first layer 41 is provided on the first insulating layer 102. As illustrated in FIG. 3E, the upper line layer 41b is a layer that includes the gate of the transistor Tws, and is also a layer that includes the second electrode of the capacitor CS. It should be noted that the upper line layer 41b also includes the gates of the transistors Td and Taz (see FIG. 3B).

In this manner, each of the transistors Td, Tws, Taz include a channel which is a portion of the lower line layer 41a, a gate which is a portion of the upper line layer 41b, and the first insulating layer 102 provided between the lower line layer 41a and the upper line layer 41b. Furthermore, the capacitor CS includes the first insulating layer 102 and the lower line layer 41a and the upper line layer 41b which sandwich the first insulating layer 102.

As illustrated in FIG. 3D and FIG. 3E, the second insulating layer 104 is provided on the first insulating layer 102 to cover the upper line layer 41b.

The metal layer 42a of the second layer 42 is provided on the second insulating layer 104. The metal layer 42a is a layer that includes the power supply lines PL (Vcc) and PL (Vss) and the signal line SL, and is a layer that includes a relay conductor for electrically connecting the lower line layer 41a and the upper line layer 41b. The thickness of the power supply lines PL (Vcc) and PL (Vss), the signal line SL, and the relay conductor, which are the metal layer 42a, is the same. Furthermore, the metal layer 42a is formed to have a thickness that is greater than the thickness of each of the upper line layer 41b and the lower line layer 41a.

The contact layers 42b of the second layer 42 are column-shaped interlayer connecting conductors that connect the metal layer 42a and a layer different from the metal layer 42a. For example, FIG. 3E, two contact layers 42b are shown. One contact layer 42b is in contact with the lower line layer 41a and penetrates through the first insulating layer 102 and the second insulating layer 104 so as to be connected to the metal layer 42a. Furthermore, the other contact layer 42b is in contact with the upper line layer 41b and penetrates through the second insulating layer 104 so as to be connected to the metal layer 42a. It should be noted that the metal layer 42a that is connected to the two contact layers 42b in FIG. 3E corresponds to the relay conductor described earlier.

The third insulating layer 106 is provided on the second insulating layer 104 to cover the metal layer 42a and the contact layers 42b. The third insulating layer 106 is, for example, formed by applying a liquid organic resin material on the second insulating layer 104.

As illustrated in FIG. 3D, the organic EL element 10 is provided on the third insulating layer 106 via the anode metal layer 111. The organic EL element 10 has an opening 51 which is a region from which emitted light exits. The opening 51 is surrounded by a bank (partition) 115 provided on the third insulating layer 106, and has a rectangular external shape. It should be noted that a sealing resin layer may be additionally provided on the organic EL element 10.

Here, as illustrated in FIG. 3A, when the subpixels R1 and R2 are seen in a plan view (i.e., when seen from the thickness direction of the TFT substrate 20), the first layer 41 has a portion disposed in line symmetry between the same-colored subpixels R1 and R2. Specifically, the transistors Td, Tws, and Taz and the capacitor CS of the respective subpixels R1 and R2 are arranged in reflection symmetry with respect to center line CL1 (see FIG. 2A) located between the subpixels R1 and R2 in the column direction.

Furthermore, as illustrated in FIG. 3A, when the subpixels R1 and R2 are seen in a plan view, the second layer 42 is disposed at an identical position in the respective openings 51 of the same-colored subpixels R1 and R2. It should be noted that, here, "identical position" means that the position (relative coordinates) of the second layer 42 relative to the center of each of the openings 51 is the same.

For example, in the opening 51 of the subpixel R1, the signal line SL is provided at a position that overlaps with the left side of the opening 51 which is rectangular, and the power supply line PL (Vcc) is provided at a position that overlaps with the right side of the opening 51. The relay conductor described above is provided at a position that is located slightly in the Y direction positive side from the center of the opening 51. Furthermore, the contact layer 42b is provided; two at positions overlapping with the relay conductor, and one at a position that is in the X direction positive side from the center of the opening 51 and overlaps with the power supply line PL (Vcc).

On the other hand, in the opening 51 of the subpixel R2, the signal line SL is provided at a position that overlaps with the left side of the opening 51 which is rectangular, and the power supply line PL (Vss) is provided at a position that overlaps with the right side of the opening 51. The relay conductor described above is provided at a position that is located slightly in the Y direction positive side from the center of the opening 51. Furthermore, the contact layer 42b is provided; two at positions overlapping with the relay conductor, and one at a position that is in the X direction positive side from the center of the opening 51 and overlaps with the power supply line PL (Vss). It should be noted that, in the subpixel R2, the contact layer 42b provided at a position that overlaps with the power supply line PL (Vss) is a dummy layer provided correspondingly so as to be at the same position as the contact layer 42b provided in the subpixel R1, and is not connected to electrical elements such as a TFT element and the capacitor CS.

In this embodiment, by placing the second layer 42 at an identical position in the respective openings 51 of the same-colored subpixels R1 and R2 in the above manner, the step (or unevenness) that is formed on the surface of the organic EL elements 10 can be formed at an identical position in the openings 51. Accordingly, the openings 51 of the same-colored subpixels R1 and R2 have the same film thickness distribution, and thus the viewing angle characteristics of the display device 1 can be improved.

It should be noted that the subpixels G1 and G2 of the pixels 30a and 30b have the same relationship as the subpixels R1 and R2, and the subpixels B1 and B2 of the pixels 30a and 30b have the same relationship as the subpixels R1 and R2. Accordingly, the openings 51 of the respective subpixels G1 and G2 have the same film thickness distribution and the openings 51 of the respective subpixels B1 and B2 have the same film thickness distribution, and thus the viewing angle characteristics of display device 1 can be improved.

1-4. Advantageous Effects, Etc

With the display device 1 having the above-described configuration, viewing angle characteristics can be improved compared to a display device in comparative example in which both the first layer 41 and the second layer 42 are arranged in line symmetry. In order to facilitate understanding, the configuration of the display device in the comparative example will be described.

Figure 4:
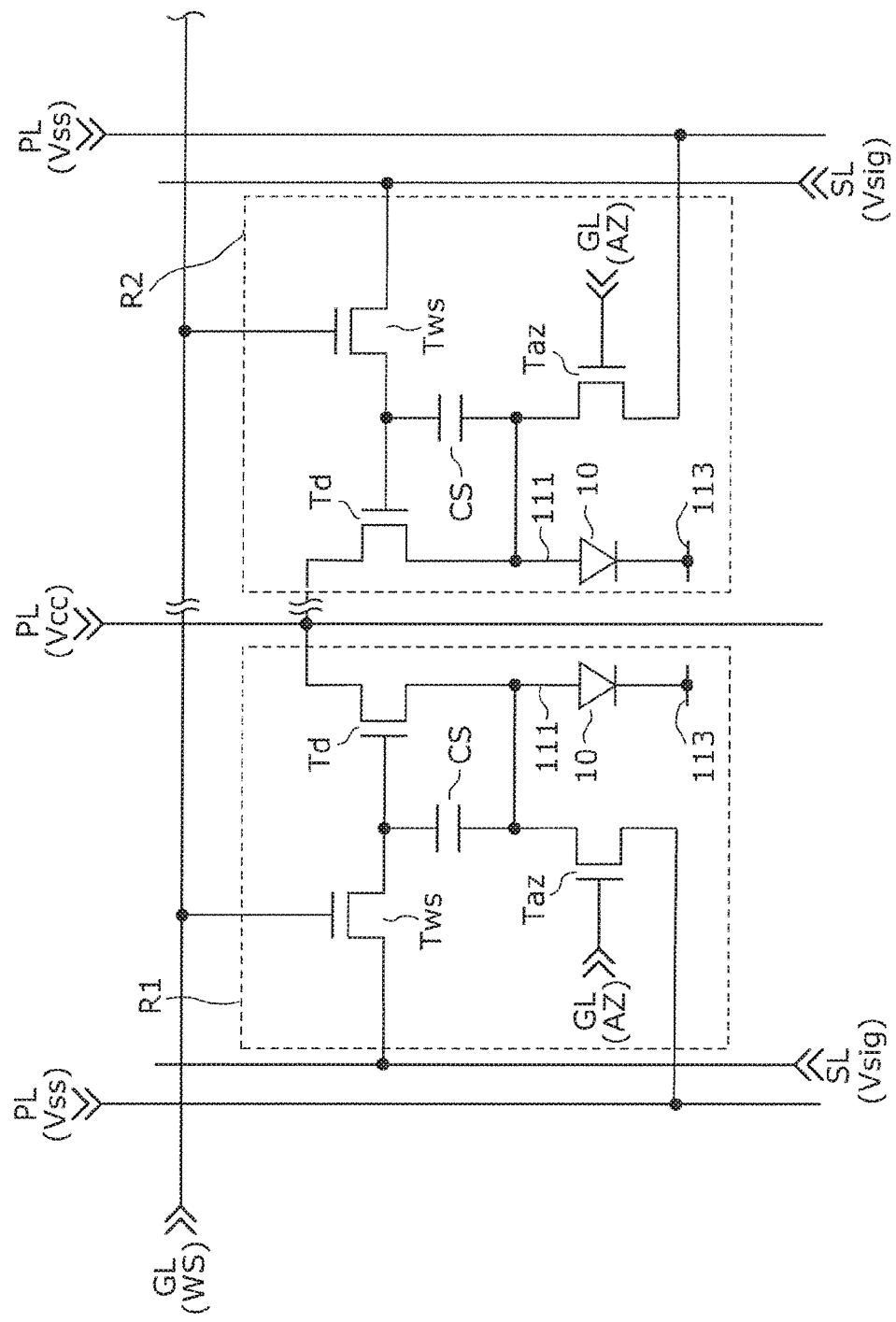
FIG. 4 is a circuit diagram illustrating same-colored subpixels of pixels in a comparative example.
Figure 5A:
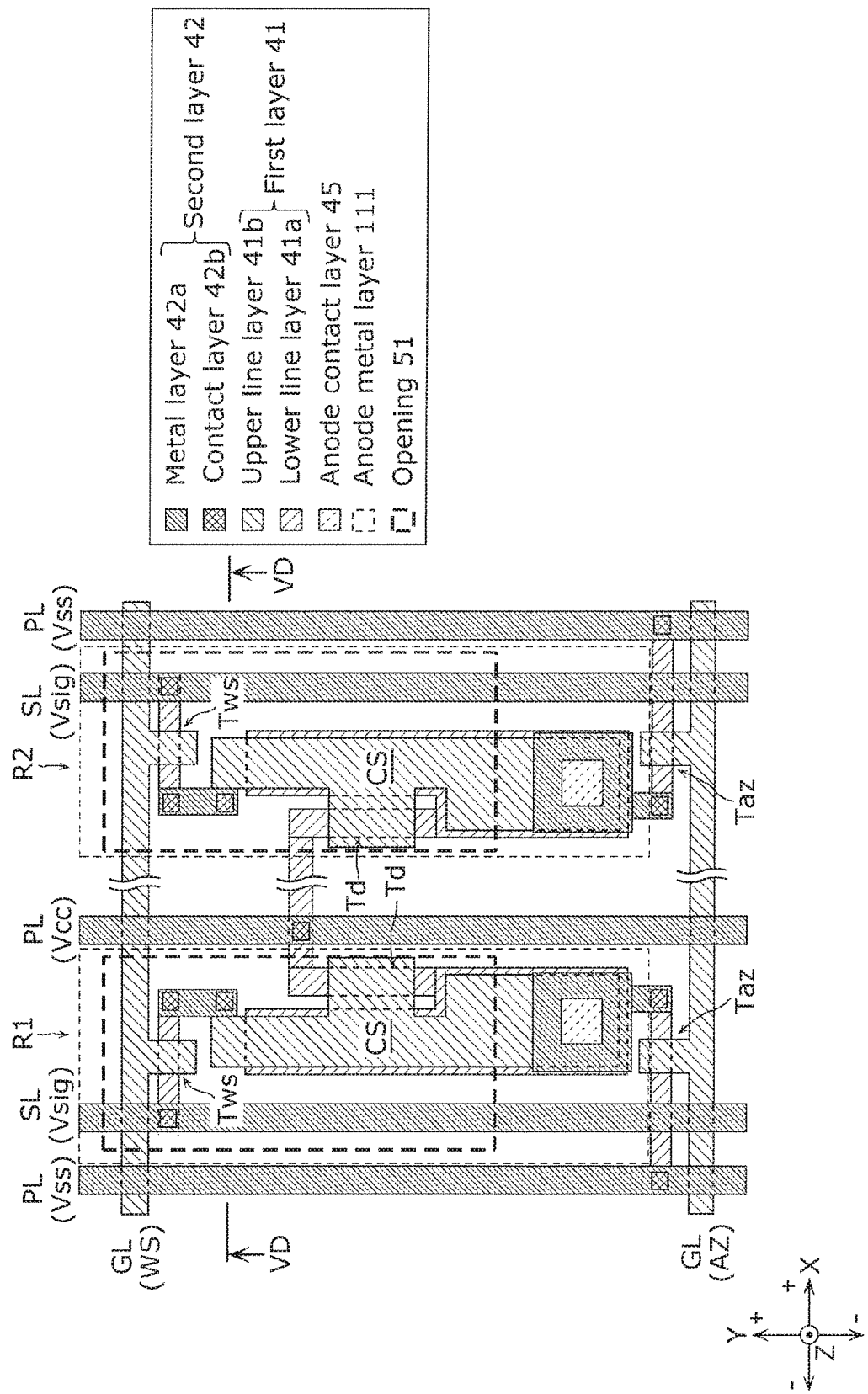
FIG. 5A is a plan view of a wiring layout of the same-colored subpixels in the comparative example.
Figure 5D:
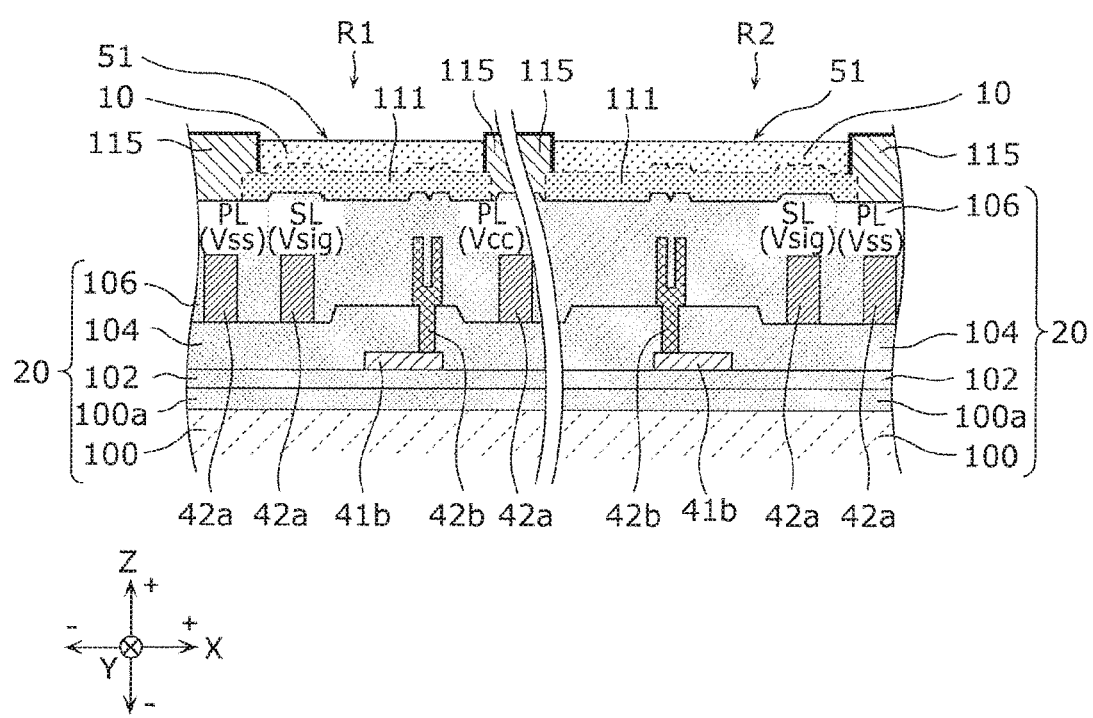
FIG. 5D is a cross-sectional view (cross-sectional view taken along line VD-VD in FIG. 5A) of wiring of the same-colored subpixels in the comparative example.

FIG. 4 is a circuit diagram illustrating the same-colored subpixels R1 and R2 of the pixels 30 in the comparative example. FIG. 5A is a plan view of the wiring layout of the same-colored subpixels R1 and R2 in the comparative example. FIG. 5B is a plan view of the arrangement of the first layer 41 in the same-colored subpixels R1 and R2 in the comparative example. FIG. 5C is a plan view of the arrangement of the second layer 42 in the same-colored subpixels R1 and R2 in the comparative example. FIG. 5D is a cross-sectional view (cross-sectional view taken along line VD-VD in FIG. 5A) of the wiring of the same-colored subpixels R1 and R2 in the comparative example.

Compared to the subpixels R1 and R2 according to the embodiment, the subpixels R1 and R2 illustrated in FIG. 4 to FIG. 5D have the same circuit configuration connection relationship but have different wiring layouts. Specifically, in the pixels 30 in the comparative example, the wiring layout of the same-colored subpixels R1 and R2 of the two pixels 30a and 30b adjacent in the column direction (X direction) are in perfect line symmetry.

In FIG. 4 to FIG. 5D, the same-colored subpixels R1 and R2 are illustrated in an extracted state. As in the display device in the comparative example, by arranging the respective components of the same-colored subpixels R1 and R2 in line symmetry, the number of power supply lines PL with respect to the number of subpixels can be reduced.

However, the display device in the comparative example has the problem indicated below. For example, although the third insulating layer 106 of the TFT substrate 20 is formed by applying the material of the third insulating layer 106 on the second layer 42, the surface of the third insulating layer 106 after drying is not perfectly flat and there are cases where a step is formed on the surface as illustrated in FIG. 5D. Specifically, due to the thickness of the second layer 42, the surface of the third insulating layer 106 is formed projecting in a convex shape in the region in which the second layer 42 is disposed. As such, when the organic EL element 10 is formed by additionally applying a liquid organic resin material on the third insulating layer 106, a step is also formed on the surface of the organic EL element 10 as a negative effect of the aforementioned step.

As described above, in the display device in the comparative example, the wiring layout of the respective opening 51 of the subpixels R1 and R2 are in line symmetry, and the second layer 42 is disposed at different positions in each of the openings 51. As such, the step formed on the surface of the organic EL element 10 is formed at different positions in the respective openings 51 of the subpixels R1 and R2. Accordingly, the respective openings 51 of the subpixels R1 and R2 have mutually different thickness distributions, and thus the viewing angle characteristics of the display device deteriorate.

In response to this, the active-matrix display device 1 according to this embodiment includes a plurality of pixels 30 arranged in a matrix, and each of the plurality of pixels 30 includes a plurality of subpixels R, G, B that are arranged along a predetermined direction (for example, the X direction) and emit light of mutually different colors. Each of the plurality of subpixels R, G, B has a TFT element provided in the TFT substrate 20, and an organic EL element 10 that is provided on the TFT substrate 20 and emits light according to the driving by the TFT element. The organic EL element 10 has an opening 51 which is a region from which emitted light exits, and the TFT substrate 20 has a first layer 41 and a second layer 42. In addition, when same-colored subpixels (for example, R1 and R2) of pixels 30a and 30b which are adjacent in the predetermined direction are seen from the thickness direction of the TFT substrate 20, the first layer 41 has a portion arranged in line symmetry between the same-colored subpixels R1 and R2; and the second layer 42 is disposed at an identical position in the respective openings 51 of the same-colored subpixels R1 and R2.

In this manner, by placing the second layer 42 at an identical position in the respective openings 51 in the same-colored subpixels R1 and R2, the step (or unevenness) that is formed on the surface of the organic EL elements 10 can be formed at an identical position in the openings 51. Accordingly, the openings 51 of the same-colored subpixels R1 and R2 have the same film thickness distribution, and thus the viewing angle characteristics of the display device 1 can be improved. Furthermore, in the display device 1, by arranging the first layer 41 in line symmetry, the shape and the peripheral potential of the electrical elements such as the TFT elements making up the subpixels R1 and R2 can be made the same, and electrical properties such as the parasitic capacitance and the parasitic resistance occurring in the TFT substrate 20 can be made uniform.

The display device 1 may further include a power supply line PL that supplies power to each of the plurality of subpixels R, G, B. The power supply line PL may extend along a direction (for example, the Y direction) orthogonal to the predetermined direction and may be shared by the plurality of subpixels R, G, B that are adjacent in the predetermined direction.

With this configuration, the number of power supply lines PL with respect to the number of the subpixels R, G, B can be reduced. As such, the area of the subpixels R, G, B can be made small, and thus high-definition enhancement of the display device 1 becomes possible.

Furthermore, in the thickness direction of the TFT substrate 20, the second layer 42 may be disposed closer to the organic EL light-emitting element 10 than the first layer 41 is.

In this manner, even if the second layer 42, which tends to affect the step formation on the surface of the organic EL element 10, is arranged on the organic EL element 10 side, placing the second layer 42 at an identical position in the respective openings 51 enables the step to be formed at an identical position in the openings 51. Accordingly, the openings 51 of the same-colored subpixels R1 and R2 have the same film thickness distribution, and thus the viewing angle characteristics of the display device 1 can be improved.

Furthermore, the second layer 42 may include a power supply line PL that supplies power to the plurality of subpixels R, G, B or a signal line SL that supplies signal voltage to the plurality of subpixels R, G, B.

In this manner, even when the second layer 42 includes a power supply line PL or a signal line SL with a thick film thickness, placing the power supply line PL or the signal line SL at an identical position in the respective openings 51 enables the step to be formed at an identical position in the openings 51. Accordingly, the openings 51 of the same-colored subpixels R1 and R2 have the same film thickness distribution, and thus the viewing angle characteristics of the display device 1 can be improved.

Furthermore, the second layer 42 may include contact layers 42b that connect (i) a metal layer 42a including a power supply line PL that supplies power to the plurality of subpixels R, G, B or a signal line SL that supplies signal voltage to the plurality of subpixels R, G, B and (ii) a layer different from the metal layer 42a.

In this manner, even when the second layer 42 includes the contact layers 42b that connect the metal layer 42a and a layer different from the metal layer 42a, placing the contact layers 42b at an identical position in the respective openings 51 enables the step to be formed at the same position in the openings 51. Accordingly, the openings 51 of the same-colored subpixels R1 and R2 have the same film thickness distribution, and thus the viewing angle characteristics of the display device 1 can be improved.

In addition, the TFT substrate 20 may include a substrate 100, a first insulating layer 102, a second insulating layer 104, and a third insulating layer 106. The first layer 41 may include a lower line layer 41a and an upper line layer 41b, and the second layer 42 may include the metal layer 42a and the contact layers 42b. The lower line layer 41a may be provided on the substrate 100, and the first insulating layer 102 may be provided on the substrate 100 to cover the lower line layer 41a. The upper line layer 41b may be provided on the first insulating layer 102, and the second insulating layer 104 may be provided on the first insulating layer 102 to cover the upper line layer 41b. The metal layer 42a may be provided on the second insulating layer 104. The contact layers 42b may include: a layer that is in contact with the upper line layer 41b, penetrates through the second insulating layer 104, and is connected to the metal layer 42a; and a layer that is in contact with the lower line layer 41a, penetrates through the first insulating layer 102 and the second insulating layer 104, and is connected to the metal layer 42a. The third insulating layer 106 may be provided on the second insulating layer 104 to cover the metal layer 42a and the contact layers 42b.

In this manner, even when the second layer 42 includes the metal layer 42a and the contact layers 42b and is provided on the second insulating layer 104, placing the second layer 42 at an identical position in the respective openings 51 enables the step to be formed at the same position in the openings 51. Accordingly, the openings 51 of the same-colored subpixels R1 and R2 have the same film thickness distribution, and thus the viewing angle characteristics of the display device 1 can be improved.

Furthermore, the lower line layer 41a may include the channel of the TFT element (transistors Td Tws, Taz), and the upper line layer 41b may include the gate of the TFT element.

In this manner, by configuring the channel and gate of the TFT element using the lower line layer 41a and the upper line layer 41b, respectively, which are located closer to the substrate 100 than the second insulating layer 104 is, the negative effect of the step caused by the thickness of the TFT element can be reduced, and thus the viewing angle characteristics of the display device 1 can be improved.

Each of the plurality of subpixels R, G, B may further include a capacitor CS connected to the TFT element, and the capacitor CS may have a first electrode and a second electrode disposed at opposing positions. The lower line layer 41a may include the first electrode, and the upper line layer 41b may include the second electrode.

In this manner, by configuring the first electrode and the second electrode of the capacitor CS using the lower line layer 41a and the upper line layer 41b, respectively, which are located closer to the substrate 100 than the second insulating layer 104 is, the negative effect of the step caused by the thickness of the capacitor CS can be reduced, and thus the viewing angle characteristics of the display device 1 can be improved.

1-5. Variation

Figure 6:
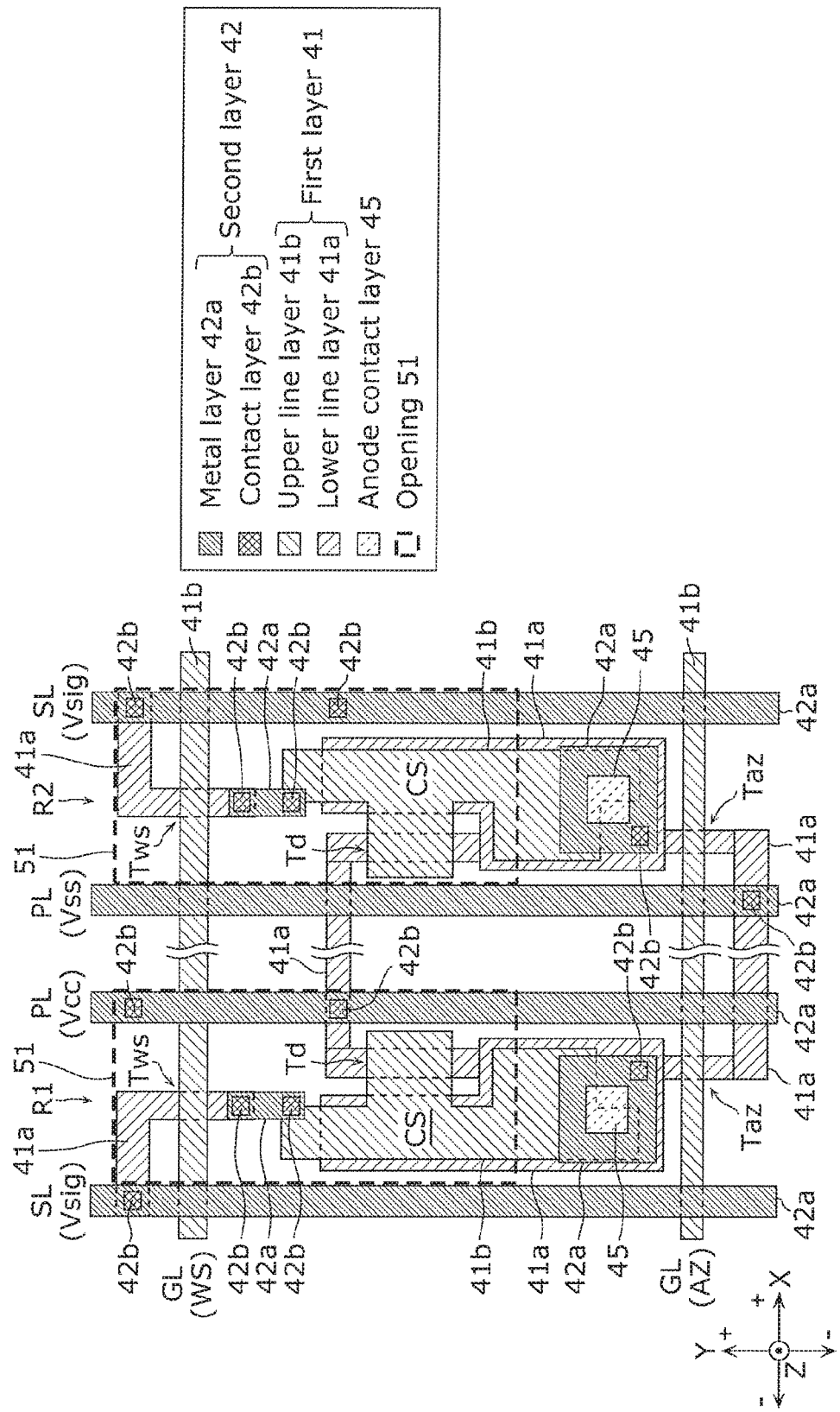
FIG. 6 is a plan view of a wiring layout of same-colored subpixels of pixels according to a variation of the embodiment.

FIG. 6 is a plan view of the wiring layout of the same-colored subpixels R1 and R2 of the pixels 30 according to a variation of the foregoing embodiment. In the pixels 30 according to the variation, the positions of the power supply line PL (Vss) and the signal line SL of the subpixel R2 are the reverse of those in the foregoing embodiment.

As illustrated in FIG. 6, when the subpixels R1 and R2 are seen in a plan view, the first layer 41 is arranged in line symmetry between the same-colored subpixels R1 and R2. Specifically, the transistors Td, Tws, and Taz and the capacitor CS of the respective subpixels R1 and R2 are arranged in reflection symmetry with respect to a center line located between the subpixels R1 and R2 in the column direction.

Furthermore, as illustrated in FIG. 6, when the subpixels R1 and R2 are seen in a plan view, the second layer 42 is disposed at an identical position in the respective openings 51 of the same-colored subpixels R1 and R2.

For example, in the opening 51 of the subpixel R1, the signal line SL is provided at a position that overlaps with the left side of the opening 51 which is rectangular, and the power supply line PL (Vcc) is provided at a position that overlaps with the right side of the opening 51. The relay conductor is provided at a position that is located slightly in the Y direction positive side from the center of the opening 51. Furthermore, the contact layer 42b is provided; two at positions overlapping with the relay conductor, and one at a position that is in the X direction positive side from the center of the opening 51 and overlaps with the power supply line PL (Vcc).

On the other hand, in the opening 51 of the subpixel R2, the power supply line PL (Vss) is provided at a position that overlaps with the left side of the opening 51, and the signal line SL is provided at a position that overlaps with the right side of the opening 51. The relay conductor is provided at a position that is located slightly in the Y direction positive side from the center of the opening 51. Furthermore, the contact layer 42b is provided; two at positions overlapping with the relay conductor, and one at a position that is in the X direction positive side from the center of the opening 51 and overlaps with the signal line SL. It should be noted that, in the subpixel R2, the contact layer 42b provided at a position that overlaps with the signal line SL is a dummy layer provided correspondingly so as to be at the same position as the contact layer 42b provided in the subpixel R1, and is not connected to electrical elements such as a TFT element and the capacitor CS.

In the display device 1 according to the variation, by placing the second layer 42 at an identical position in the respective openings 51 in the same-colored subpixels R1 and R2, the step that is formed on the surface of the organic EL elements 10 can be formed at an identical position in the openings 51. Accordingly, the openings 51 of the same-colored subpixels R1 and R2 have the same film thickness distribution, and thus the viewing angle characteristics of the display device 1 can be improved.

(Other Forms)

Although the active-matrix display device 1 according to the present disclosure has been described up to this point based on the foregoing exemplary embodiment, the present disclosure is not limited to the foregoing embodiment. Variations obtained by various modifications to the foregoing exemplary embodiment that that can be conceived by a person of skill in the art which are within the scope of the essence of the present disclosure and various devices equipped with the active-matrix display device 1 according to the present disclosure are included in the present disclosure.

For example, as a configuration of the display device for driving the organic EL element 10, the foregoing description describes what is called a 3Tr1C in which the pixel 30 includes the three transistors Td, Tws, and Taz, and the one capacitor CS. However, the configuration of the display device 1 is not limited to such, and may for example be what is called a 2Tr1C configuration in which the pixel 30 includes the transistor Td and the transistor Tws, and the capacitor CS.

Furthermore, although the transistors Td, Tws, and Taz are described as n-channel TFTs, they may be p-channel TFTs. Furthermore, part of the plurality of transistors may be a TFT of the n-channel type and the rest may be a TFT of the p-channel type. Furthermore, each of the transistors Td, Tws, and Taz are not limited to being a top-gate TFT element, and may be a bottom-gate TFT element.

Furthermore, the light-emitting element is not limited to the organic EL element 10 which emits light according to a current, and may be for example an inorganic EL element using an inorganic compound that emits light according to a voltage.

Figure 7:
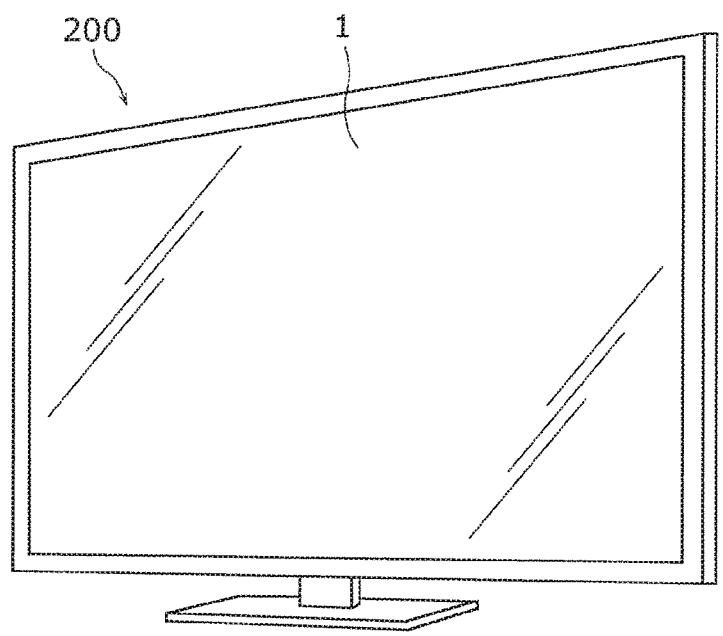
FIG. 7 is an external view of a flat-screen display device.

For example, the active-matrix display device 1 may be implemented as a flat-screen display device 200 illustrated in FIG. 7. FIG. 7 is an external view of the flat-screen display device 200. The flat-screen display device 200 is capable of displaying video, and so on, with high display quality.

INDUSTRIAL APPLICABILITY

An active-matrix display device according to the present disclosure is useful as a display device, etc., from which high display quality is required.

The invention claimed is:

1. An active-matrix display device, comprising:
a plurality of pixels arranged in a matrix,
wherein each of the plurality of pixels includes a plurality of subpixels that are arranged along a predetermined direction and emit light of mutually different colors,
each of the plurality of subpixels includes:
a TFT element provided on a TFT substrate; and
a light-emitting element that is provided on the TFT substrate and emits light according to driving by the TFT element,
the light-emitting element has an opening which is a region from which emitted light exits,
the TFT substrate includes a first layer and a second layer, and
when same-colored subpixels that emit light of a same color out of the plurality of subpixels included in two of the plurality of pixels that are adjacent in the predetermined direction are seen from a thickness direction of the TFT substrate:
the first layer has a portion arranged in line reflection symmetry between the same-colored subpixels; and
the second layer is disposed at an identical position in respective openings of the same-colored subpixels.

2. The active-matrix display device according to claim 1, further comprising:
a power supply line that supplies power to each of the plurality of subpixels,
wherein the power supply line extends along a direction orthogonal to the predetermined direction and is shared by the plurality of subpixels that are adjacent in the predetermined direction.

3. The active-matrix display device according to claim 1, wherein, in the thickness direction of the TFT substrate, the second layer is disposed closer to the light-emitting element than the first layer is.

4. The active-matrix display device according to claim 1, wherein the second layer includes one of a power supply line that supplies power to the plurality of subpixels and a signal line that supplies signal voltage to the plurality of subpixels.

5. The active-matrix display device according to claim 1, wherein the second layer includes a contact layer that connects a metal layer and a layer different from the metal layer, the metal layer including one of a power supply line that supplies power to the plurality of subpixels and a signal line that supplies signal voltage to the plurality of subpixels.

6. The active-matrix display device according to claim 5, wherein the TFT substrate includes a substrate, a first insulating layer, a second insulating layer, and a third insulating layer,
the first layer includes a lower line layer and an upper line layer,
the second layer includes the metal layer and the contact layer,
the lower line layer is provided on the substrate,
the first insulating layer is provided on the substrate to cover the lower line layer,
the upper line layer is provided on the first insulating layer,
the second insulating layer is provided on the first insulating layer to cover the upper line layer,
the metal layer is provided on the second insulating layer,
the contact layer includes:
a layer that is in contact with the upper line layer, penetrates through the second insulating layer, and is connected to the metal layer; and
a layer that is in contact with the lower line layer, penetrates through the first insulating layer and the second insulating layer, and is connected to the metal layer, and
the third insulating layer is provided on the second insulating layer to cover the metal layer and the contact layer.

7. The active-matrix display device according to claim 6, wherein the lower line layer includes a channel of the TFT element, and
the upper line layer includes a gate of the TFT element.

8. The active-matrix display device according to claim 6, wherein each of the plurality of subpixels further includes a capacitor connected to the TFT element,
the capacitor has a first electrode and a second electrode disposed at opposing positions,
the lower line layer includes the first electrode, and
the upper line layer includes the second electrode.

* * * * *